US009896283B2

(12) United States Patent
Tsuji et al.

(10) Patent No.: US 9,896,283 B2
(45) Date of Patent: Feb. 20, 2018

(54) ARTICLE TRANSPORT FACILITY

(71) Applicant: Daifuku Co., Ltd., Osaka-shi (JP)

(72) Inventors: Tomohiko Tsuji, Hinocho (JP); Kazuya Asahi, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

(21) Appl. No.: 15/352,916

(22) Filed: Nov. 16, 2016

(65) Prior Publication Data

US 2017/0137240 A1    May 18, 2017

(30) Foreign Application Priority Data

Nov. 17, 2015    (JP) .................................. 2015-225077

(51) Int. Cl.
*B65G 69/22*    (2006.01)
*H01L 21/677*    (2006.01)
*H01L 21/687*    (2006.01)

(52) U.S. Cl.
CPC .......... *B65G 69/22* (2013.01); *H01L 21/6773* (2013.01); *H01L 21/67733* (2013.01); *H01L 21/67736* (2013.01); *H01L 21/68707* (2013.01); *B65G 2201/0297* (2013.01)

(58) Field of Classification Search
CPC ...... B65G 2201/0297; H01L 21/67757; H01L 21/67769; H01L 21/67736; H01L 21/67781
USPC ............... 414/281, 282, 286, 626; 198/346.3
See application file for complete search history.

(56) References Cited

U.S. PATENT DOCUMENTS

| 6,183,184 B1* | 2/2001 | Shiwaku ............. B65G 1/0464 212/327 |
| 6,851,913 B2* | 2/2005 | Iizuka ....................... B66C 1/28 414/626 |
| 7,210,589 B2* | 5/2007 | Iizuka .................... B66C 13/06 212/270 |
| 8,374,719 B2* | 2/2013 | Inui .......................... B61B 3/02 414/217 |
| 8,490,802 B2* | 7/2013 | Honda ...................... B61B 3/02 212/330 |
| 8,757,401 B2* | 6/2014 | Uchino ............. H01L 21/67733 212/331 |
| 8,826,825 B2* | 9/2014 | Shibata .................... B61B 3/02 104/288 |
| 9,263,311 B2* | 2/2016 | Ota ....................... B65G 1/0457 |
| 9,312,158 B2* | 4/2016 | Wada ..................... B66C 13/06 |
| 9,758,177 B2* | 9/2017 | Takada .................... B61B 3/02 |
| 9,758,310 B2* | 9/2017 | Murao ................... B65G 43/00 |

FOREIGN PATENT DOCUMENTS

JP    200912916 A    1/2009

OTHER PUBLICATIONS

US 2012/0045302 A1, Izuka et al., Feb. 23, 20132 (Year: 2012).*
US 2013/0195588 A1, Shibata et al., Aug. 1, 2013 (Year: 2013).*

* cited by examiner

*Primary Examiner* — Douglas A Hess
(74) *Attorney, Agent, or Firm* — The Webb Law Firm

(57) ABSTRACT

An article transport facility includes a support member capable of supporting a second support component from below while allowing a vertical movement of a first support component with respect to the second support component, in a projected state in which the second support component is located in a projected position. The support member is supported directly or indirectly by a ceiling.

6 Claims, 8 Drawing Sheets

ARTICLE TRANSPORT FACILITY

CROSS-REFERENCE TO RELATED APPLICATION

This application claims priority to Japanese Patent Application No. 2015-225077 filed Nov. 17, 2015, the disclosure of which is hereby incorporated in its entirety by reference.

FIELD OF THE INVENTION

The present invention relates to an article transport facility comprising a transport device capable of traveling along a travel path formed on a ceiling side to transport an article, and a transport target location which functions as a transport origin or a transport destination for an article for a transporting operation by the transport device.

BACKGROUND

One known example of article transport facilities such as one described above is described in JP Publication of Application No. 2009-12916 (Patent Document 1). The transport device provided to the article transport facility of Patent Document 1 has a travel portion (travel portion 110) which travels in and along a travel path, a first support component (grip portion 150) that can supports an article, and a second support component (movement portion 140) that suspends and supports the first support component. As shown in FIGS. 1 and 2 of Patent Document 1, this transport device is configured to be capable of moving the second support component along a path width direction (lateral width direction of the travel path) with respect to a travel portion, between a retracted position within the travel path and a projected position located to one side of the travel path. And in order to prevent the transport device from tilting due to the shifting of the center of gravity that accompanies the movement of the second support component from the retracted position to the projected position, the transport device of Patent Document 1 is provided with a tilting prevention mechanism (an outrigger 200) which prevents the transport device from tilting by coming into contact with a travel rail (a track 300) from below.

SUMMARY OF THE INVENTION

To reduce the manufacturing cost, it is desirable to keep the structure of the transport device from becoming more complex while, to reduce energy consumption, it is desirable to reduce an amount of any increase in the weight of the transport device that travels along the travel path. In this respect, the technology of Patent Document 1 is such that the tilting of the transport device in the projected state (in which the second support component is in the projected position) is prevented only by the tilting prevention mechanism provided to the transport device. This tends to increase the complexity of the tilting prevention mechanism, and to increase also the weight of the tilting prevention mechanism. As a result, with the technology of Patent Document 1, it is not easy to keep the transport device provided with such tilting prevention mechanism from becoming complex and heavier.

Therefore, an article transport facility is desired in which the tilting of the transport device in a projected state can be restricted while the structure of the transport device can be kept from becoming more complex and an amount of any increase in the weight of the transport device can be reduced.

In light of the above, an article transport facility is arranged as follows. Specifically, the article transport facility comprises a transport device capable of traveling along a travel path formed on a ceiling side to transport an article, and a transport target location which functions as a transport origin or a transport destination for an article for a transporting operation by the transport device, wherein the transport target location is located at a position that is lower than the travel path and that is outside the travel path along a path width direction which is a lateral width direction of the travel path, wherein the transport device includes a travel portion capable of traveling in and along the travel path, a first support component capable of supporting an article, a second support component which suspends and supports the first support component, a first actuator capable of vertically moving the first support component with respect to the second support component, and a second actuator capable of moving the second support component along the path width direction with respect to the travel portion between a retracted position in which the second support component is in the travel path and a projected position in which the second support component overlaps with the transport target location as seen along a vertical direction. The characteristic arrangement of such article transport facility is that a support member is provided which is capable of supporting the second support component from below while allowing a vertical movement of the first support component with respect to the second support component, in a projected state which is a state in which the second support component is located in the projected position, wherein the support member is supported directly or indirectly by a ceiling.

In other words, the article transport facility is provided with a support member capable of supporting the second support component from below, in the projected state. Therefore, in the projected state in which a large moment load tends to occur in the transport device because the second support component is in the projected position, the support member can receive a load due to the second support component which suspends and supports the first support component. Thus, the moment load that the transport device has to bear can be reduced by the corresponding amount. As a result, the magnitude of the moment load that the transport device bears can be reduced to within a proper range, in the projected state so that it becomes possible to restrict the tilting of the transport device.

And the support member is not a member provided to the transport device. The transport device only needs to have a structure to transmit a load to the support member. As such, an arrangement for receiving the load due to the second support component is realized by the support member while the structure of the transport device can be kept from becoming more complex and an amount of any increase in the weight of the transport device can be reduced. In addition, if and when a tilting prevention mechanism is provided to the transport device, in addition to the support member, it is possible to decrease the weight-bearing requirement for the tilting prevention mechanism by the corresponding amount. Thus, a tilting prevention mechanism having a relatively simple structure can be used. Therefore, even when a tilting prevention mechanism is provided to the transport device in addition to the support member, the structure of the transport device can be kept from becoming more complex and an amount of any increase in the weight of the transport device can be reduced, compared with when the support member is not provided.

As such, with the characteristic arrangement described above, an article transport facility can be provided in which the tilting of the transport device in the projected state can be restricted while the structure of the transport device can be kept from becoming more complex and an amount of any increase in the weight of the transport device can be reduced. Note that, since the support member is supported directly or indirectly by the ceiling, the support member can receive the load due to the second support component with stability. In addition, since the support member is provided such as to allow the vertical movement of the first support component with respect to the second support component, an article can be transferred between the transport device and the transport target while the support member receives the load due to the second support component.

DETAILED DESCRIPTION

Figure 2:
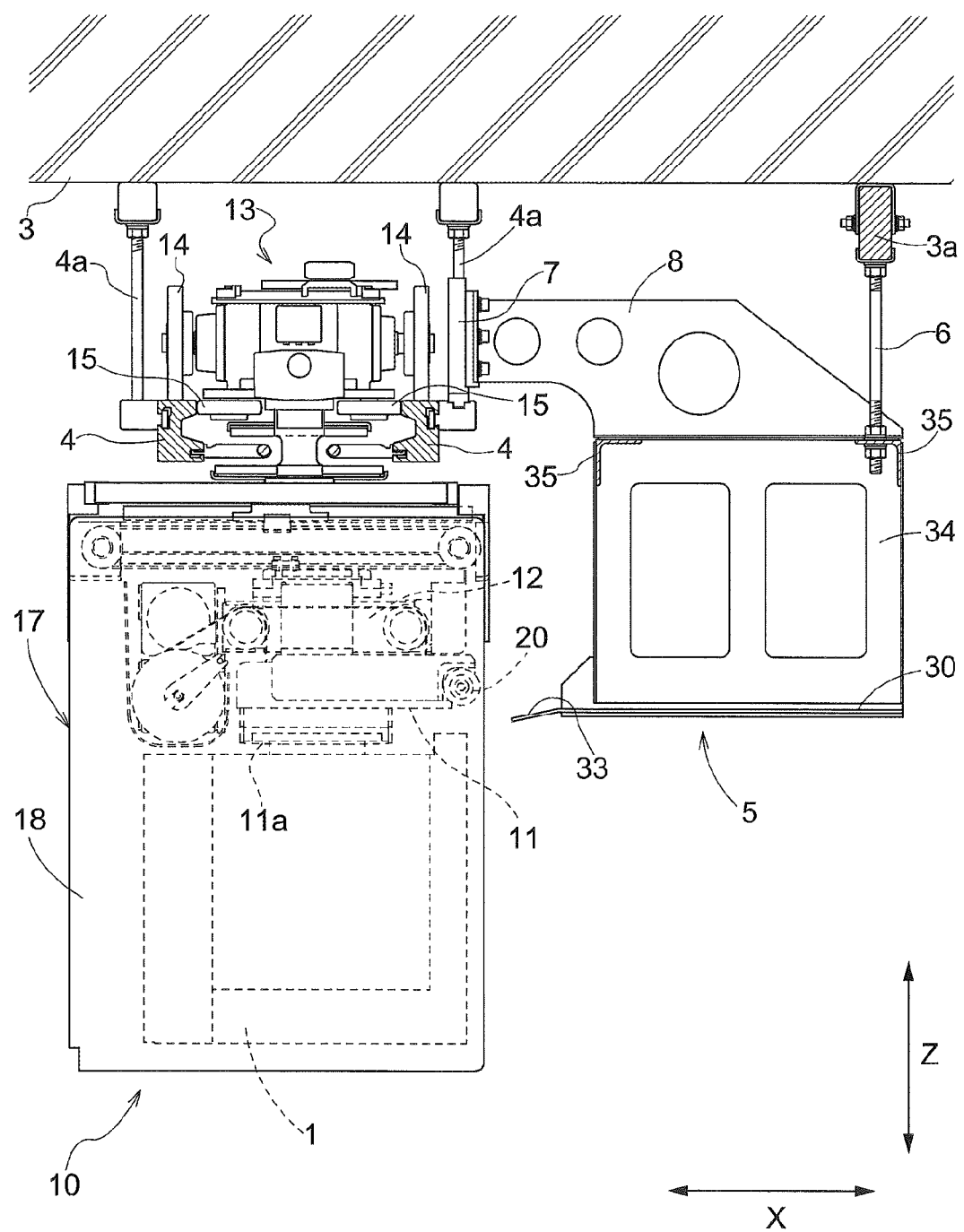
FIG. 2 shows a second support component at its retracted position, and a first support component at its first height.
Figure 5:
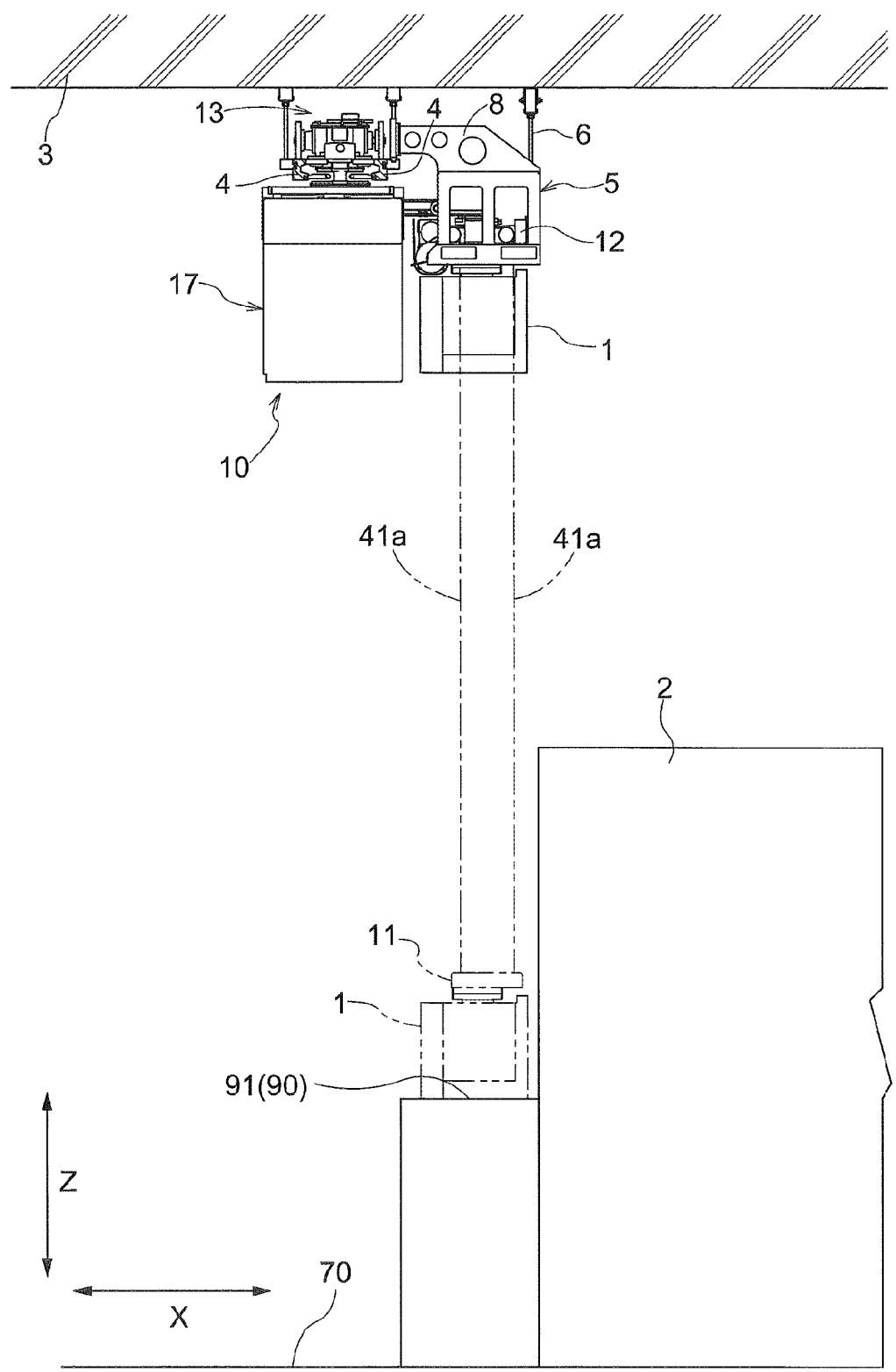
FIG. 5 is a front view of a portion of the article transport facility in accordance with the embodiment.

Embodiments of an article transport facility are described next with reference to the attached drawings. As shown in FIG. 5, the article transport facility includes one or more transport devices 10 and one or more transport target locations 90. Each transport device 10 travels along a travel path formed on the ceiling side (ceiling 3 side) to transport articles 1, one article at a time. Here, a travel path is an extent of the space in which the transport device 10 and the article 1 supported by the transport device 10 move when the transport device 10 travels. As shown in FIG. 2, in the present embodiment, when the transport device 10 travels, the article 1 is located within the main body portion 17 provided to the transport device 10. Thus, in the present embodiment, the space in which the article 1 moves when the transport device 10 travels is included in the space in which the transport device 10 moves when the transport device 10 travels.

The expression "formed on the ceiling side" with regard to the travel path means that, when a certain height between the floor 70 and the ceiling 3 is defined to be a reference height, the travel path is formed such that at least a portion of the travel path is at a position higher than the reference height. The reference height may, for example and among other heights, be a height that is at a vertical midpoint between the ceiling 3 and the floor 70 (i.e., the height that is at the same vertical (along the up and direction) distance from the ceiling 3 and from the floor 70), or may be a height that is, or corresponds to, a height (average height) of workers working in the article transport facility. As shown in FIG. 5, in the present embodiment, the reference height is set to be the height at the midpoint between the ceiling 3 and the floor 70, and the entire travel path is located at the position higher than the reference height. In addition, the ceiling 3 forms a surface that defines the upper limit of the space in which the article transport facility is installed. The floor 70 forms a surface that defines the lower limit of the space in which the article transport facility is installed. That is, the ceiling 3 provides a partition on the upper side of the space in which the article transport facility is installed whereas the floor 70 provides a partition on the lower side of the space in which the article transport facility is installed. In the following description, the direction along the travel path (the longitudinal direction of the travel path) will be referred to as the path longitudinal direction Y whereas the lateral width direction of the travel path will be referred to the path width direction X. The path width direction X is perpendicular to both the path longitudinal direction Y and the vertical direction Z.

Each transport target location 90 can function as one or both of the transport origin (a location from which an article is transported) and the transport destination (a location to which an article is transported) for the transporting operation of articles 1 by the transport device 10. That is, the transport device 10 transports articles 1, one article at a time, from one transport target location 90 to another location (another transport target location 90, or a storage device, etc.). In addition, the transport device 10 also transports articles 1, one article at a time, from other locations to a transport target location 90. As shown in FIG. 5, each transport target location 90 is located at a position lower than, or below, the travel path, and outside the travel path along the path width direction X. More specifically, with an article support portion defined to be the portion of a transport target location 90 that supports the article 1 when transferring an article 1 between the transport device 10 and the transport target location 90 (i.e., the portion that is supporting the article 1 shown with phantom lines in the example shown in FIG. 5), at least the article support portion of the transport target location 90 is at a lower position than the travel path, and is outside the travel path along the path width direction X. The article transport facility is provided with a plurality of transport target locations 90, and the travel path is formed such as to pass through article transfer positions each of which corresponds to an associated one of the transport target locations 90. Here, each article transfer position is displaced, or offset, along the path width direction X from the corresponding transport target location 90. And an article 1 is transferred between the transport device 10 and the transport target location 90 while the travel portion 13 (described below) of the transport device 10 is at rest at an article transfer position that corresponds to the transport target location 90.

In the present embodiment, each article 1 is a container for holding one or more substrates, such as semiconductor substrates, and, more specifically, is a FOUP (Front Opening Unified Pod). As shown in FIG. 5, the article transport facility includes processing devices 2 each of which performs one or more processes on the substrates held in and carried thereto by the articles 1. And each transport target location 90 consists of a support platform (load port) which is adjacent the corresponding processing device 2 and which is installed on the floor 70. Although detailed description is omitted, each processing device 2 includes a device that transports either the article 1 or the substrates held in the article 1 and carried thereto, between the transport target location 90 and inside the processing device 2. Each transport target location 90 may include a conveyor etc. for transporting articles 1.

Figure 4:
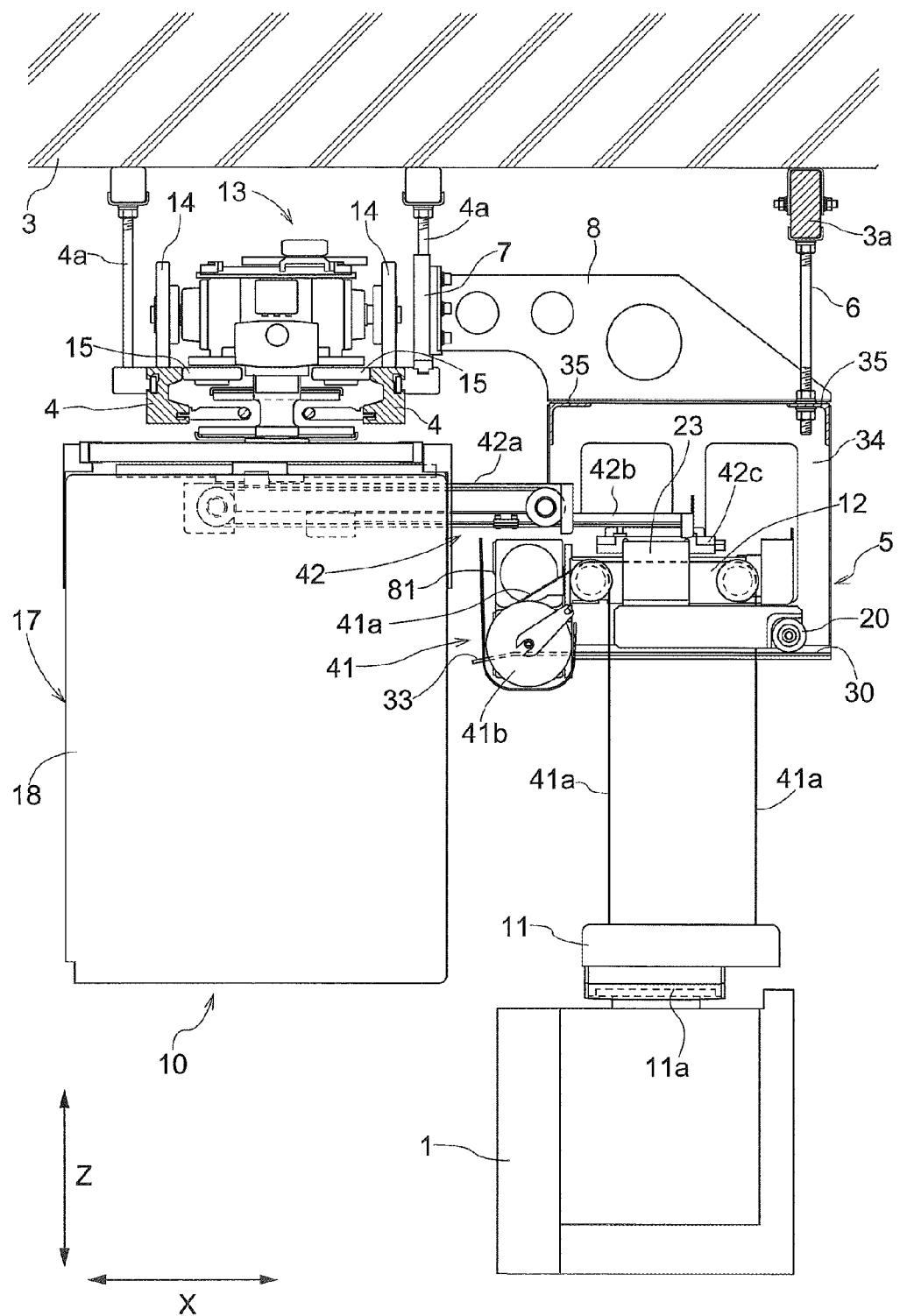
FIG. 4 shows the second support component in its projected position, and the first support component is located at a height between the first height and a second height.

As shown in FIG. 4, the transport device 10 includes a travel portion 13 capable of traveling in and along the travel path, a first support component 11 capable of supporting an article 1, a second support component 12 for suspending and supporting the first support component 11, a first actuator 41, and a second actuator 42. The first actuator 41 is an actuator for raising and lowering the first support component 11 (i.e., for causing the first support component 11 to be moved along the vertical direction Z) with respect to the second support component 12 whereas the second actuator 42 is an actuator for moving the second support component 12 along the path width direction X with respect to the travel portion 13. In the present embodiment, the transport device 10 has a main body portion 17 which is suspended from and supported by the travel portion 13. And the second support component 12 is supported by the travel portion 13 through the main body portion 17. And the second actuator 42 moves the second support component 12 along the path width direction X with respect to the travel portion 13 by moving the second support component 12 along the path width direction X with respect to the main body portion 17. Note that the position of the main body portion 17 along the vertical direction Z is fixed with respect to the travel portion 13 whereas the position of the second support component 12 along the vertical direction Z is fixed with respect to the main body portion 17. Therefore, the position of the second support component 12 along the vertical direction Z is fixed with respect to the travel portion 13.

Figure 1:
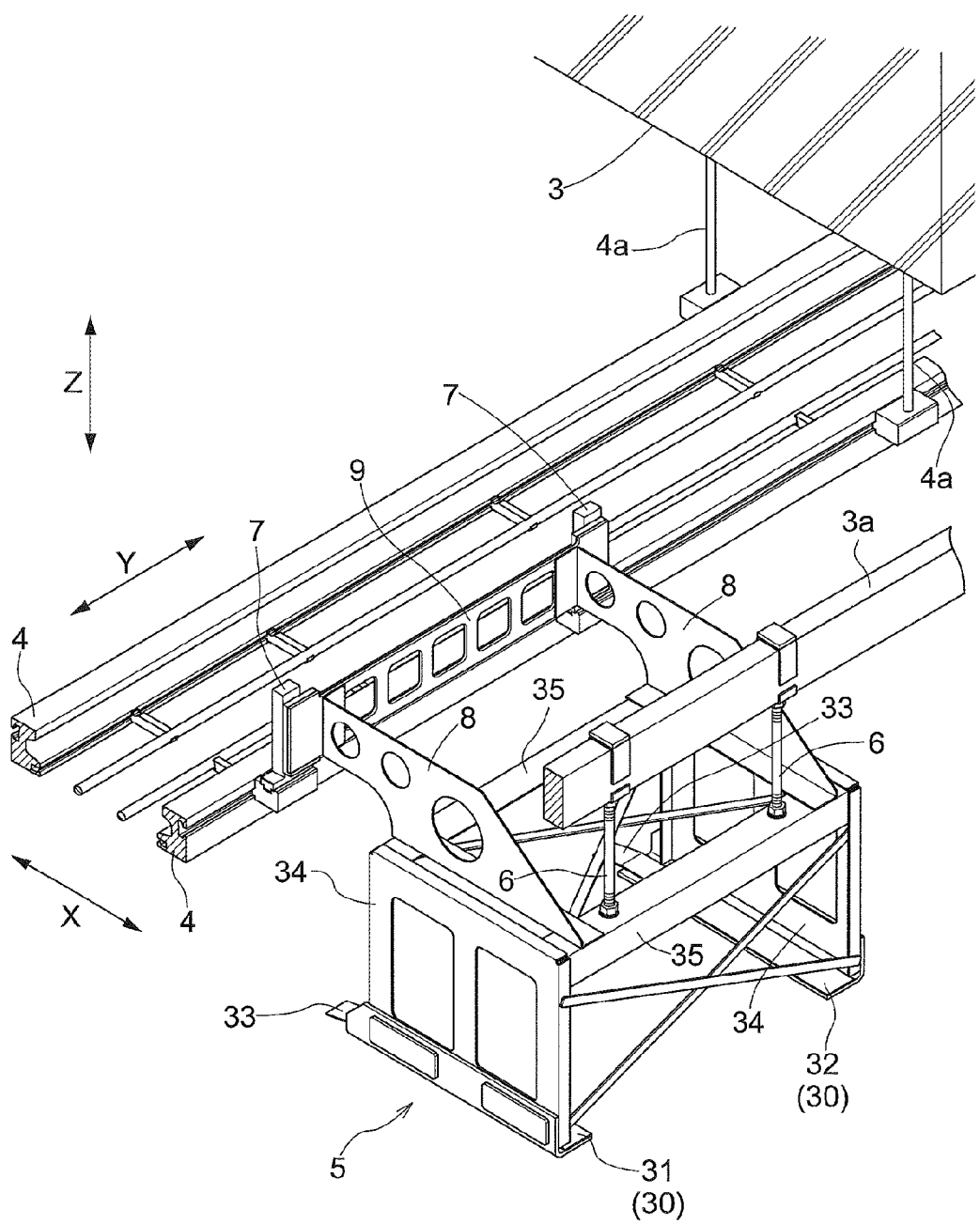
FIG. 1 is a perspective view of a portion of an article transport facility in accordance with an embodiment.

As shown in FIG. 2, in the present embodiment, the travel portion 13 is configured to travel along the travel path with the travel portion 13 supported by the travel rails 4 which are suspended from the ceiling 3. The main body portion 17 is suspended from and supported by the travel portion 13 such that the main body portion is located below the travel rails 4. As shown in FIG. 1, the travel rails 4 are installed such that they extend along the path longitudinal direction Y. In the present embodiment, the travel rails 4 are fixed to the ceiling 3 by rail support members 4a that are provided at a plurality of positions along the path longitudinal direction Y. As shown in FIG. 2, the travel portion 13 has travel wheels 14 which roll on the top surfaces of the travel rails 4 so that the travel portion 13 is supported by the travel rails 4 with the travel wheels 14 in contact with the travel rails 4 from above. In the present embodiment, a pair of travel rails 4 are provided along the travel path. The pair of travel rails 4 are spaced apart from each other along the path width direction X. The travel portion 13 has one or more travel wheels 14 that roll on the top surface of one of the pair of travel rails 4 and one or more travel wheels 14 that roll on the top surface of the other of the pair of travel rails 4. In the present embodiment, the travel portion 13 travels by means of the actuating force of a drive motor 83 (see FIG. 7) provided to the travel portion 13. More specifically, the travel portion 13 travels along travel path as a result of the fact that one or more of the travel wheels 14 are driven and rotated by the drive motor 83. Thus, in the present embodiment, a third actuator 43 that is an actuator which causes the travel portion 13 to travel along the travel path includes the drive motor 83 and the travel wheels 14.

The travel portion 13 has guide wheels 15 which restrict movement of the travel portion 13 along the path width direction X to guide the traveling of the travel portion 13. The guide wheels 15 are configured to rotate freely about their respective vertical axes. And the travel portion 13 travels along the direction along which the travel rails 4 extend (i.e., along the travel path) with the guide wheels 15 being guided by the corresponding side faces of the travel rails 4. In the present embodiment, the travel portion 13 has a guide wheel 15 which is in contact with one of the pair of travel rails 4 from the inner side along the path width direction X, and another guide wheel 15 which is in contact with the other of the pair of travel rails 4 from the inner side along the path width direction X. The movement of the travel portion 13 along the path width direction X is restricted as a result of the fact that each of the pair of guide wheels 15 is in contact with the corresponding one of the travel rails 4 along the path width direction X from the inner side. Note that the word "inner" and other similar words such as "inward" or "inward direction" along the path width direction X is associated with a direction that is along the path width direction X and that is toward the center of the travel portion 13 whereas "outward" direction along the path width direction X is the direction opposite from the "inward" direction. In the present embodiment, the inward direction is the direction that is along the path width direction X and that is toward a point that is at an equal distance, along the path width direction X, from each of the pair of travel rails 4.

Figure 3:
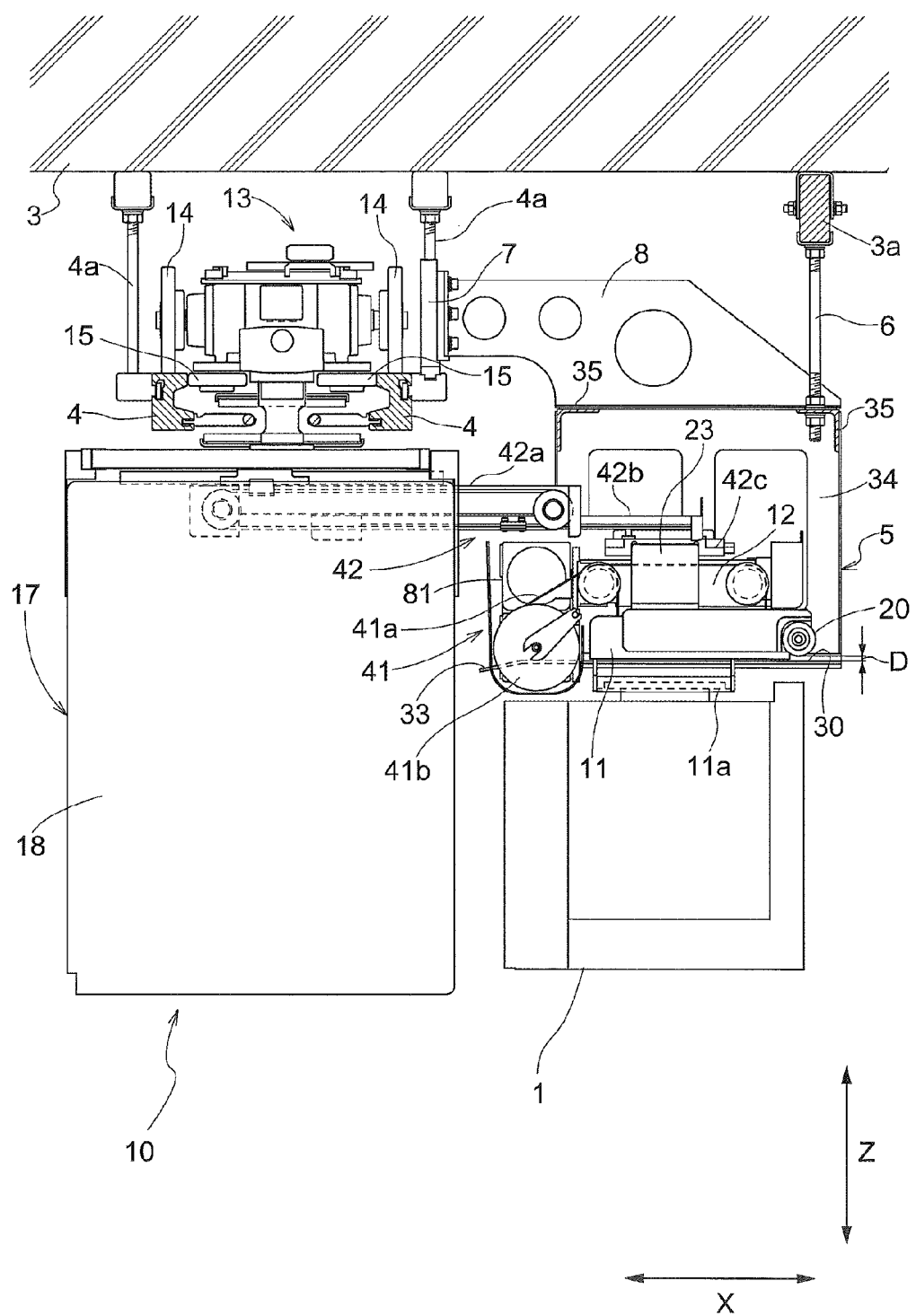
FIG. 3 shows the second support component in its projected position, and the first support component at its first height.

The second support component 12 is moved by the second actuator 42 between a retracted position in which the second support component 12 is in the travel path and a projected position in which the second support component 12 overlaps with the transport target location 90 as seen along the vertical direction Z. The projected position is a position outside the travel path. FIG. 2 shows the transport device 10 with the second support component 12 at the retracted position. In addition, FIGS. 3-5 show the transport device 10 with the second support component 12 in the projected position. In the present embodiment, the retracted position is a position within a space (referred to, hereinafter, as "holding space") which is partitioned off on both sides along the path longitudinal direction Y from its exterior by a cover portion 18 provided to the main body portion 17. The cover portion 18 is so arranged that, when the first support component 11 is at a first height described below and the second support component 12 is at the retracted position (state shown in FIG. 2), the cover portion 18 covers both sides, along the path longitudinal direction Y, of the article 1 supported by the first support component 11. This holding space is open to the space outside the holding space (space outside of the travel path) through one or more openings formed on at least one side (both sides in the present embodiment) along the path width direction X (see FIG. 6). And the second support component 12, the first support component 11 suspended and supported by the second support component 12, and an article 1 supported by the first support component 11 are moved between inside and outside of the holding space through such opening without contacting the cover portion 18 when the second support component 12 is moved between the retracted position and the projected position.

Figure 7:
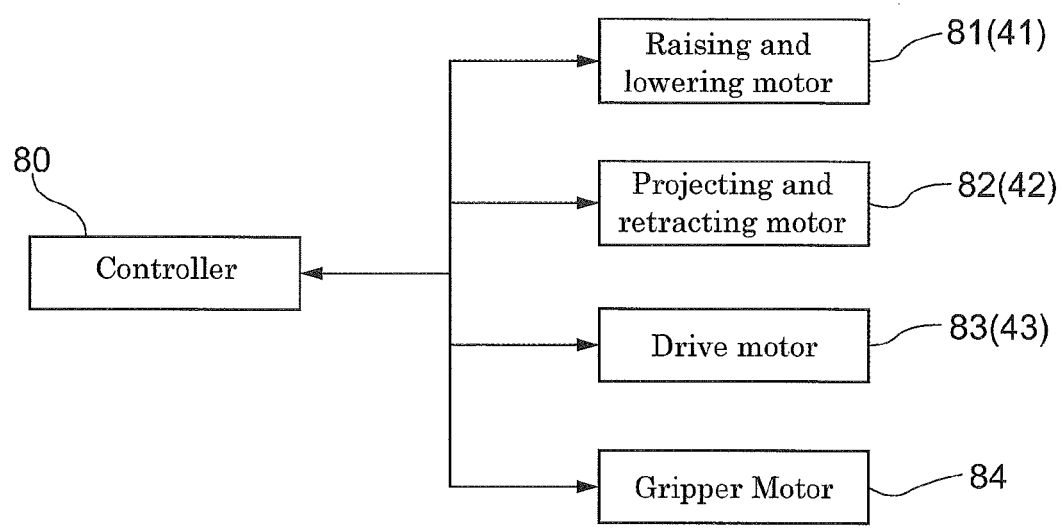
FIG. 7 is a control block diagram in accordance with the embodiment.

In the present embodiment, the second actuator 42 moves the second support component 12 between the retracted position and the projected position by means of the actuating force of a motor for projecting and retracting operations (projecting and retracting motor) 82 (see FIG. 7). More specifically, as shown in FIG. 3, the second actuator 42 has a first movement portion 42a, a second movement portion 42b, and a third movement portion 42c, in addition to the projecting and retracting motor 82. The first movement portion 42a is connected to the main body portion 17 such that the first movement portion 42a can be moved with respect to the main body portion 17 along the path width direction X. The second movement portion 42b is connected to the first movement portion 42a such that the second movement portion 42b can be moved with respect to the first movement portion 42a along the path width direction X. The third movement portion 42c is connected to the second movement portion 42b such that the third movement portion 42c can be moved with respect to the second movement portion 42b along the path width direction X. And the second support component 12 is fixed to the third movement portion 42c so that the second support component 12 is moved along the path width direction X integrally with the third movement portion 42c.

From the state (state shown in FIG. 2) in which the second support component 12 is in the retracted position, the second actuator 42 moves the second support component 12 to the projected position by: slidingly moving the first movement portion 42a outward along the path width direction X ("outward" will be referred to, hereinafter, as the "projected position side") with respect to the main body portion 17; slidingly moving the second movement portion 42b to the projected position side with respect to the first movement portion 42a; and slidingly moving the third movement portion 42c to the projected position side with respect to the second movement portion 42b, by means of the actuating force of the projecting and retracting motor 82. And from the state (state shown in FIG. 2) in which the second support component 12 is in the projected position, the second actuator 42 moves the second support component 12 to the retracted position by: slidingly moving the first movement portion 42a inward along the path width direction X ("inward" will be referred to, hereinafter, as the "retracted position side") with respect to the main body portion 17; slidingly moving the second movement portion 42b to the retracted position side with respect to the first movement portion 42a; and slidingly moving the third movement portion 42c to the retracted position side with respect to the second movement portion 42b, by means of the actuating force of the projecting and retracting motor 82. While detailed description is omitted, in the present embodiment, the second actuator 42 includes an operatively connecting mechanism for operatively coupling the movement, along the path width direction X, of each of the first movement portion 42a, the second movement portion 42b, and the third movement portion 42c so that the second actuator 42 is configured to move the second support component 12 between the retracted position and the projected position by means of the actuating force of one projecting and retracting motor 82. Note that the second actuator 42 may be alternatively configured to move the second support component 12 between the retracted position and the projected position by means of actuating forces from two or more projecting and retracting motors 82.

The first support component 11 is vertically moved between a first height and a second height by the first actuator 41. Here, the first height is such a height that the first support component 11 is in the travel path, with the second support component 12 in the retracted position. In the present embodiment, the first height is such a height that the first support component 11 is within the holding space described above, with the second support component 12 in the retracted position. The height of the first support component 11 as shown in FIGS. 2 and 3 is the first height. In addition, the second height is a lower height than the first height and is a height at which the article 1 is transferred between the transport target location 90 and the first support component 11. The height of the first support component 11 shown with phantom lines in FIG. 5 is the second height.

In the present embodiment, the first actuator 41 vertically moves the first support component 11 between the first height and the second height by means of the actuating force of a raising and lowering motor (a motor for raising and lowering) 81 (see FIGS. 3 and 7). More specifically, as shown in FIG. 3, the first actuator 41 has belts 41a and a winding member 41b in addition to the raising and lowering motor 81. Note that the belts 41a are an example of cords, and that other types of cords such as wires or cables may be used in place of the belts 41a. The belts 41a are wound around the winding member 41b and their ends are connected to the first support component 11. In addition, the winding member 41b is fixed to the second support component 12. Thus the second support component 12 suspends and supports the first support component 11 by means of the belts 41a. The first actuator 41 spools and feeds out the belts 41a as the winding member 41b is rotated in a forward direction and its opposite direction by the actuating force of the raising and lowering motor 81, to raise and lower the first support component 11. Note that the first actuator 41 has three or four belts 41a.

Figure 6:
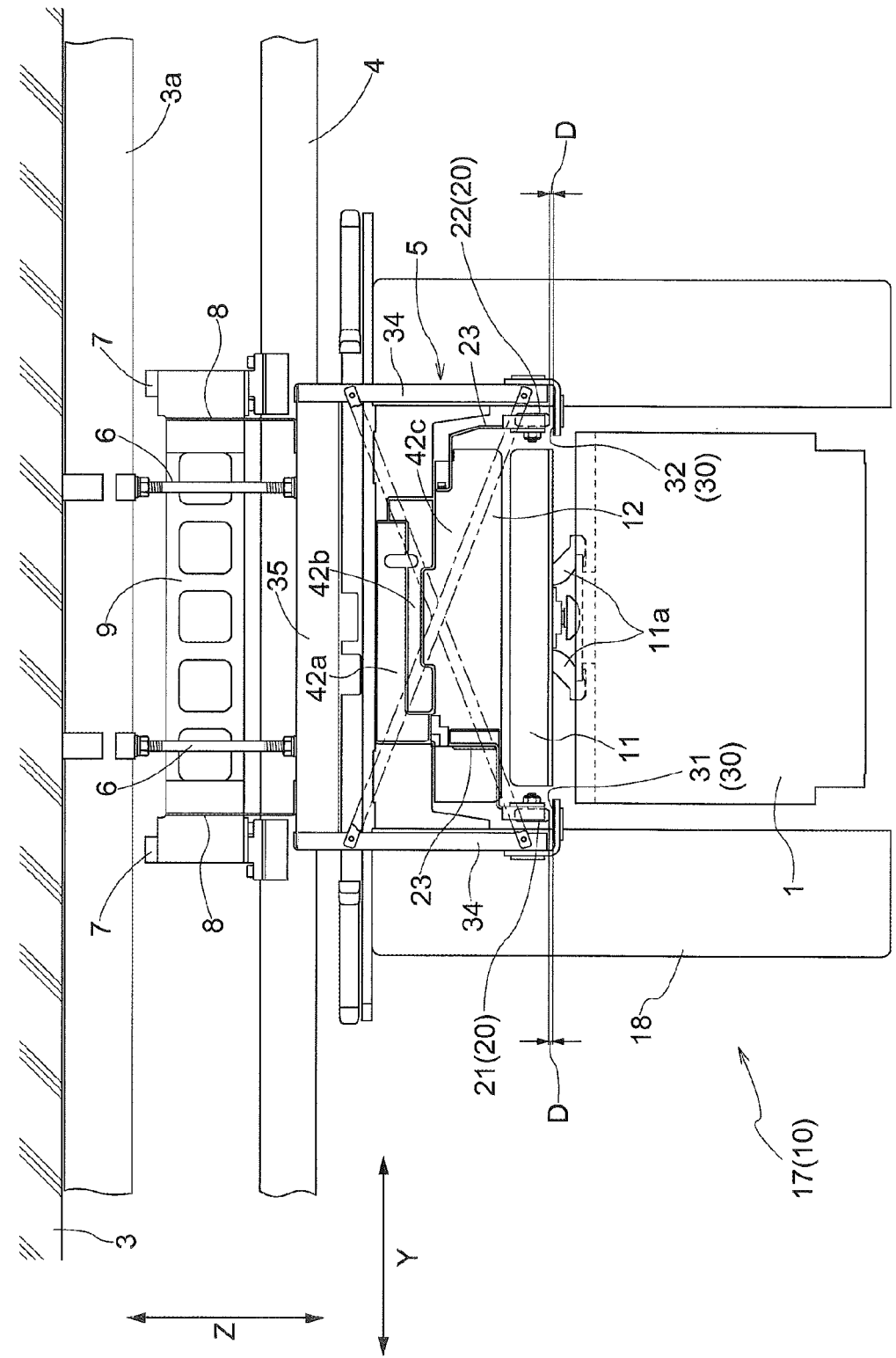
FIG. 6 is a side view of a portion of the article transport facility in accordance with the embodiment.

As shown in FIG. 6, in the present embodiment, a flange portion is formed in the upper portion of each article 1. And the first support component 11 has a pair of grip portions 11a for griping or holding the flange portion. Note that the travel portion 13 is omitted in FIG. 6 to simplify the drawing. The flange portion is connected to a main body portion of the article 1 such that the flange portion is located above the main body portion so that an inserting space is formed between the main body portion and the flange portion. The pair of grip portions 11a support an undersurface of the flange portion from below with each of support portions of the pair of grip portions 11a inserted in the inserting space (as shown in FIG. 6). The first support component 11 has a gripper motor 84 (a motor for effecting the gripping or holding) (see FIG. 7). The attitudes of the pair of grip portions 11a are switched or changed, by means of the actuating force of the gripper motor 84, between gripping attitudes (see FIG. 6) for griping or holding an article 1 and releasing attitudes for releasing the gripping of the article 1. In other words, the support portions of the pair of the grip portion 11a in their gripping attitudes are moved farther apart from each other to switch the attitudes of the pair of grip portions 11a to the releasing attitudes. And the support portions of the pair of the grip portion 11a in their releasing attitudes are moved closer to each other to switch the attitudes of the pair of grip portions 11a to the gripping attitudes.

The article transport facility includes a controller 80 for controlling the operation of the transport device 10. As shown in FIG. 7, the controller 80 is configured to control actuation or operation of each of the raising and lowering motor 81 (of the first actuator 41), the projecting and retracting motor 82 (of the second actuator 42), the drive motor 83 (of the third actuator 43), and the gripper motor 84. The controller 80 controls actuation or operation of the raising and lowering motor 81 to cause the first support component 11 to be vertically moved, controls actuation or operation of the projecting and retracting motor 82 to cause the second support component 12 to be moved along the path width direction X, and controls actuation or operation of the gripper motor 84 to cause the attitudes of the pair of grip portions 11a to be switched or changed. In addition, the controller 80 controls actuation or operation of the drive motor 83 to cause the travel portion 13 to travel. As shown in FIGS. 2 and 3, in the present embodiment, the controller 80 is configured to cause the second support component 12 to be moved between the retracted position and the projected position with the first support component 11 located at the first height. Note that the controller 80 has a processor such as a microcomputer and its peripheral circuits, such as, a memory circuit, etc. And each function of the controller 80 is realized by a collaboration between such hardware and computer programs executed by the hardware, such as the processor.

The controller 80 controls the operation of the transport device 10 based on commands from a superordinate controller (not shown). The controls performed by the controller 80 include a first control for causing the transport device 10 in a state in which the first support component 11 is not supporting any article (which state will be referred to, hereinafter, as the "empty load state") to receive an article 1 from a transport target location 90 that is the transport origin, and a second control for causing the transport device 10 in a state in which the first support component 11 is supporting an article 1 (which state will be referred to, hereinafter, as the "loaded state") to deliver the article to a transport target location 90 that is the transport destination. As will be clear from the following description, each of the first control and the second control includes a control for causing the transport device 10 to travel to the position along the travel path that corresponds to a transport target location 90, and subsequently causing the second support component 12 to be accelerated and then decelerated to cause it to be moved from the retracted position to the projected position. In addition, a time period in which the second support component 12 is moved at a constant speed may be included between the end of the acceleration period in which the second support component 12 is accelerated and the beginning of the deceleration period in which the second support component 12 is decelerated.

In the first control, a first travel control and a first transfer control are performed in that order. The first travel control is a control for causing the transport device 10 (travel portion 13) in the empty load state to travel to an article transfer position that corresponds to the transport target location 90 that is the transport origin. In addition, while the transport device 10 is traveling, a state is maintained in which the first support component 11 is at the first height and the second support component 12 is at the retracted position. The first transfer control is a control for performing the following controls in the following order with the transport device 10 stopped at the article transfer position: a control for causing the second support component 12 to be moved from the retracted position to the projected position, a control for causing the first support component 11 to be lowered from the first height to the second height, a control for switching or changing the attitudes of the pair of grip portions 11a from their releasing attitudes to their gripping attitudes, a control for causing the first support component 11 to be raised from the second height to the first height, and a control for causing the second support component 12 to be moved from the projected position to the retracted position. Note that the second height is set at such a height that the support portion of each of the pair of the grip portions 11a can be inserted into the inserting space described above, while the article 1 remains supported by the transport target location 90, by switching or changing attitudes of the pair of the grip portions 11a from their releasing attitudes to their gripping attitudes. Thus, while the control for causing the first support component 11 to be raised from the second height to the first height is being executed, the state of the article 1 shifts from the state in the article 1 is supported by the transport target location 90 to a state in which the article 1 is supported by the first support component 11 (i.e., by the pair of grip portions 11a in the present embodiment) when the first support component 11 is raised slightly from the second height.

In the second control, a second travel control and a second transfer control are performed in that order. The second travel control is a control for causing the transport device 10 (travel portion 13) in the loaded state to travel to an article transfer position that corresponds to the transport target location 90 that is the transport destination. The second transfer control is a control for performing the following controls in the following order with the transport device 10 stopped at the article transfer position: a control for causing the second support component 12 to be moved from the retracted position to the projected position, a control for causing the first support component 11 to be lowered from the first height to the second height, a control for switching or changing the attitudes of the pair of grip portions 11a from their gripping attitudes to their releasing attitudes, a control for causing the first support component 11 to be raised from the second height to the first height, and a control for causing the second support component 12 to be moved from the projected position to the retracted position. Thus, while the control for causing the first support component 11 to be lowered from the first height to the second height is being executed, the state of the article 1 shifts, immediately before the first support component 11 is lowered to the second height, from the state in the article 1 is supported by the first support component 11 (i.e., by the pair of grip portions 11a in the present embodiment) to a state in which the article 1 is supported by the transport target location 90. And the support portion of each of the pair of grip portions 11a is moved out from the inserting space described above by executing the control for switching or changing the attitudes of the pair of grip portions 11a from their gripping attitudes to their releasing attitudes, while the article 1 remains supported by the transport target location 90.

Incidentally, the weight of the entire transport device 10 is supported by the ceiling 3 through the pair of travel rails 4 with which the travel wheels 14 of the travel portion 13 are in contact from above. In other words, the weight of the main body portion 17 suspended from and supported by the travel portion 13 as well as the weight of each of the first support component 11 and the second support component 12 supported by the main body portion 17 are supported by the ceiling 3 through the travel portion 13. As can be seen clearly from FIG. 2, when the second support component 12 is in the retracted position, the center of gravity of each of the main body portion 17, the first support component 11, and the second support component 12 is located within a relatively narrow range, along the path width direction X, that includes the center of gravity of the travel portion 13. Therefore, there is no large moment load acting on the travel portion 13 when the second support component 12 is at the retracted position. That is, it is not necessary for the transport device 10 to bear a large moment load.

On the other hand, as can be seen clearly from FIG. 3, when the second support component 12 is in the projected position, the center of gravity of each of the first support component 11, and the second support component 12 is located far, along the path width direction X, from the center of gravity of the travel portion 13. More specifically, while the center of gravity of the travel portion 13 is located between the pair of travel rails 4 along the path width direction X, the center of gravity of the first support component 11 and the center of gravity of the second support component 12 are located outside, and not between, the pair of travel rails 4 along the path width direction X. Therefore, a greater moment load acts on the travel portion 13 when the second support component 12 is in the projected position than when the second support component 12 is in the retracted position. That is, the transport device 10 has to bear a greater moment load. And the greater the moment load becomes, the greater the necessity becomes to restrict the tilting of the transport device 10 (tilting of the travel portion 13, and tilting of the main body portion 17, etc.) by means of a mechanism additionally provided to the transport device 10, and to provide special additional reinforcing structures to increase the moment load allowed for each member or component included in the transport device 10. And when these necessities become greater, the cost and weight of the transport device 10 increase as the structure of the transport device 10 becomes more complex, among other factors. Thus, it is desirable to keep the magnitude of the moment load that acts on the travel portion 13, i.e., the magnitude of the moment load the transport device 10 needs to bear, within a proper range.

To this end, the article transport facility is provided with a support member 5 as shown in FIG. 1. The support member 5 is provided to support the second support component 12 from below when the second support component 12 is in the projected position (which state will be referred to as the "projected state"), while allowing the vertical movement of the first support component 11 with respect to the second support component 12. Therefore, in the projected state in which a large moment load tends to act on the travel portion 13, the support member 5 can support the weight of the second support component 12 which suspends and supports the first support component 11. That is, the support member 5 can receive and support the moment load that occurs in the transport device 10 so that the moment load that acts on the travel portion 13 can be reduced by the corresponding amount. In addition, the support member 5 is supported directly or indirectly by the ceiling 3. Therefore, at least a part of the weight of the second support component 12 is supported by the ceiling 3 through the support member 5.

As shown in FIG. 5, the support member 5 is located on the same side, with respect to the travel path of the transport device 10, as the transport target location 90 along the path width direction X, and at a higher position than the transport target location 90. The support member 5 is located outside the travel path. One support member 5 is provided to each transport target location 90, and is located at the same position as the corresponding transport target location 90 along the path longitudinal direction Y. More specifically, the support member 5 is so located to overlap with the transport target location 90 from above as seen along the vertical direction Z.

In the present embodiment, the support member 5 is attached to a travel rail 4 so that at least a part of the load (including weight) that acts on the support member 5 is supported by the ceiling 3 through the travel rail 4. As shown in FIG. 1, the support member 5 is attached to the travel rail 4 (of the pair of travel rails 4) that is closer to the support member 5 along the path width direction X. More specifically, the support member 5 and the travel rail 4 are connected to each other by connecting members (second connecting members 7, third connecting members 8, and a fourth connecting member 9). Therefore, a part of the weight of the support member 5 is supported by the travel rail 4 through the connecting members. In addition, each second connecting member 7 is generally formed in a shape of a column that extends upward from an area of connection between the second connecting member and the travel rail 4. Each third connecting member 8 is generally formed in a shape of a plate (thin material) or sheet that extends along the path width direction X and that connects an upper portion of the corresponding second connecting member 7 and an upper portion of the support member 5. In addition, the shape of a plate includes a shape that is generally formed in a shape of a plate with holes to, for example, reduce weight, among other reasons. In the present embodiment, two second connecting members 7 are provided with one located on one side, and the other located on the other side, of a central portion of the support member 5 along the path longitudinal direction Y; and, two third connecting members 8 are provided with one located on one side, and the other located on the other side, of the central portion of the support member 5 along the path longitudinal direction Y. And the fourth connecting member 9 is generally formed in a shape of a plate (flat material) or a sheet that extends along the path longitudinal direction Y and that connects an area of connection between the second connecting member 7 and the third connecting member 8 that are on one side along the path longitudinal direction Y and an area of connection between the second connecting member 7 and the third connecting member 8 that are on the other side along the path longitudinal direction Y. In the description of the support member below, a direction toward the center of the support member 5 along the path longitudinal direction Y will be referred to as an inward or inner direction along the path longitudinal direction whereas a direction opposite from an inward direction will be referred to as an outward or outer direction.

In the present embodiment, as shown in FIGS. 1 and 2, the support member 5 is connected to the ceiling 3 by first connecting members 6 without involving the travel rail 4. More specifically, an upper portion of the support member 5 and a fixed member 3a fixed to the ceiling 3 are mutually connected by the first connecting members 6 so that the support member 5 is suspended and supported by the ceiling 3 through the first connecting members 6. Therefore, in the present embodiment, a part of the load (including weight) that acts on the support member 5 is supported by the ceiling 3, and not through the travel rail 4. In other words, in the present embodiment, the support member 5 is attached to the travel rail 4 such that only a part of the load (including weight) that acts on the support member is supported by the ceiling 3 through the travel rail 4. In the present embodiment, two first connecting members 6 are provided with one located on one side, and the other located on the other side, of the central portion of the support member 5 along the path longitudinal direction Y.

Specific structure of the support member 5 is described next. As shown in FIG. 1, the support member 5 has support portions 30. As shown in FIGS. 3, 4, and 6, the support portions 30 are so located to overlap with supported portions 20 provided to the second support component 12 in the projected state, from below, as seen along the vertical direction Z. And as shown in FIG. 4, the second support component 12 is supported by the support member 5 from below with the supported portions 20 in contact with the corresponding support portions 30. The supported portions 20 are provided to the second support component 12 such that they are moved along the path width direction X integrally with the second support component 12. In the present embodiment, each supported portion 20 is connected, through a connecting member 23, to the third movement portion 42c to which the second support component 12 is fixed.

In the present embodiment, as shown in FIG. 6, the second support component 12 is provided with a first supported portion 21 and a second supported portion 22. The first supported portion 21 and the second supported portion 22 are the two supported portions 20 with one portion located on one side and the other portion located on the other side, of the central portion of the second support component 12 along the path longitudinal direction Y. In the present embodiment, one each of the first supported portion 21 and the second supported portion 22 is provided. And each of the first supported portion 21 and the second supported portion 22 is located outside of, and near an end portion along the path width direction X of, the space occupied by the first support component 11 (the first support component 11 located at the first height) and the second support component 12. As shown in FIG. 6, the distance, along the path longitudinal direction Y, between the first supported portion 21 and the second supported portion 22, or more specifically, the distance of separation, along the path longitudinal direction Y, between the respective inward end portions on the sides (of the first supported portion 21 and the second supported portion 22) that face each other is set to be greater than the width, along the path longitudinal direction Y, of the first support component 11 (with "inward" being defined with respect to the path longitudinal direction Y). And the first supported portion 21 and the second supported portion 22 are located at such a height that the first support component 11 at the first height is located between the first supported portion 21 and the second supported portion 22 along the path longitudinal direction Y, and at the same height as the first supported portion 21 and the second supported portion 22. That is, a part or the entirety of the area, along the vertical direction Z, in which the supported portion 20 is located overlaps with the area, along the vertical direction Z, in which the first support component 11 located at the first height is located as seen along the path longitudinal direction Y.

The support member 5 has the first support portion 31 and the second support portion 32, as shown in FIGS. 1 and 6, to correspond to the fact that the second support component 12 has the first supported portion 21 and the second supported portion 22. The first support portion 31 is the support portion 30 that is so located that it overlaps, from below, with the first supported portion 21 as seen along the vertical direction Z, in the projected state. The second support portion 32 is the support portion 30 that is so located that it overlaps, from below, with the second supported portion 22 as seen along the vertical direction Z, in the projected state. And the second support component 12 is supported by the support member 5 from below with the first supported portion 21 in contact with the first support portion 31 and with the second supported portion 22 in contact with the second support portion 32. Note that, as shown in FIG. 6, in order to allow the vertical movement of the first support component 11 with respect to the second support component 12, the distance along the path longitudinal direction Y between the first support portion 31 and the second support portion 32 is set to be greater than the width, along the path longitudinal direction Y, of the first support component 11. To describe in more detail, as shown in FIG. 6, the distance of separation, along the path longitudinal direction Y, between the respective inward end portions on the sides (of the first support portion 31 and the second support portion 32) that face each other is set to be greater than the width, along the path longitudinal direction Y, of the first support component 11 (with "inward" being defined with respect to the path longitudinal direction Y).

As shown in FIGS. 1 and 6, each support portion 30 is connected to a lower portion of a first elongate portion 34 which extends along the vertical direction Z. Each support portion 30 is connected to the corresponding first elongate portion 34 such that it projects inward along the path longitudinal direction Y from the lower portion of the corresponding first elongate portion 34. And the first elongate portion 34 to which the first support portion 31 is connected and the first elongate portion 34 to which the second support portion 32 is connected (i.e., the two first elongate portions 34) are connected to each other by second elongate portions 35 that extend along the path longitudinal direction Y. As shown in FIG. 1, in the present embodiment, each of the two first elongate portions 34 is generally formed in a shape of a plate (thin material) or a sheet which extends along the vertical direction Z and the path width direction X. And the two second elongate portions 35 are provided with one on one side and the other on the other side of a central portion of the support member 5 along the path width direction X. In other words, the two first elongate portions 34 are connected to each other by a second elongate portion 35 at each of two different positions along the path width directions X. And first connecting members 6 described above are connected to an upper portion of the second elongate portion 35 (of the two second elongate portions 35) that is located outward along the path width direction X.

As shown in FIG. 6, the distance, along the path longitudinal direction Y, between the two first elongate portions 34 is set to be greater than the maximum width, along the path longitudinal direction Y, of the space occupied by the first support component 11 (first support component 11 located at the first height) and the second support component 12. To describe in more detail, the distance of separation, along the path longitudinal direction Y, between the respective inward end portions on the sides (of the two first elongate portions 34) that face each other is set to be greater than the maximum width, along the path longitudinal direction Y, of the space occupied by the first support component 11 (first support component 11 located at the first height) and the second support component 12 (with the "inward" being defined with respect to the path longitudinal direction Y). This arrangement allows the second support component 12 and the first support component 11 supported thereby to be inserted, along the path width direction X, into the space formed between the two first elongate portions 34 when the second support component 12 is moved from the retracted position to the projected position. Note that, in the present embodiment, the distance of separation, along the path longitudinal direction Y, between the outward end portions on the outward sides of the two supported portions 20 is set to be the maximum width, along the path longitudinal direction Y, of the space occupied by the first support component 11 and the second support component 12 (with the "outward" being defined with respect to the path longitudinal direction Y).

Incidentally, when the second support component 12 is moved between the retracted position and the projected position, it is desirable to alleviate the impact of a contact between the supported portions 20 provided to the second support component 12 and the support portions 30 provided to the support member 5; and it is preferable and desirable to avoid the contact between the supported portions 20 and the support portions 30. This is because when the impact due to a contact between the supported portions 20 and the support portions 30 is large, the amount of waiting time required for the oscillation (or lateral swinging) of the first support component 11 which is suspended and supported by the second support component 12 to diminish to the allowable range for properly transferring the article 1 between the transport device 10 and the transport target location 90 is longer. And the transport efficiency decreases by the corresponding amount. In addition, when the first support component 11 is supporting an article 1, there is also a possibility that the article 1 or the contents held within the article 1 may be damaged by the impact of the contact between the supported portions 20 and the support portions 30. Further, there is also a possibility that dust may be generated by the contact between the supported portions 20 and the support portions 30. And when the installation space of the article transport facility is a clean environment in a semiconductor manufacturing factory etc., generation of dust may pose a problem.

In light of the issues above, in the present embodiment, as shown in FIGS. 3 and 6, the distance D, along the vertical direction Z, between the support portions 30 and the supported portions 20 in the projected state is set such that the distance D is greater than zero when the first support component 11 is located at the first height. As described above, in the present embodiment, the second support component 12 is moved between the retracted position and the projected position with the first support component 11 located at the first height. Thus, by setting the distance D such that it is greater than zero when the first support component 11 is located at the first height, the contact between the supported portions 20 provided to the second support component 12 and the support portions 30 provided to the support member 5, when the second support component 12 is moved between the retracted position and the projected position, can be basically (i.e., at least in design) avoided. Note that, taking into consideration the fact that the second support component 12 may be located at a lower position (that is, the distance D may be smaller) in the loaded state than in the empty load state because of the effect of a bending due to the moment load, it is preferable to set the distance D such that it is greater than zero when the first support component 11 is at the first height and in the loaded state. Note that, the loaded state in this context may, for example, be a state in which the first support component 11 is supporting an article 1 having the maximum weight conceivable for an article 1 which is transported by the transport device 10. In the present embodiment, since the article 1 is a container for holding one or more substrates, the article 1 having the maximum weight conceivable would be an article 1 carrying the maximum number of substrates within the container.

When vertically moving the first support component 11 between the first position and the second position, the moment load that occurs in the transport device 10 may increase when the speed of the vertical movement of the first support component 11 changes (i.e., at a time of acceleration or deceleration). In light of this point, in the present embodiment, the distance D for when the first support component 11 is located at the first height is set to be such a value that the distance D becomes zero (i.e., the supported portions 20 come into contact with the support portions 30) before the moment load that acts on the travel portion 13 exceeds an allowable value. When the moment load that occurs in the transport device 10 increases, the support portions 30 are allowed to contact the supported portions 20 so that the moment load that occurs in the transport device 10 can be received by the support members 5, before the moment load that acts on the travel portion 13 exceeds the allowable value. For example, the distance D, with the first support component 11 located at the first height, is set to be about 1 mm. In addition, the allowable value of the moment load that acts on the travel portion 13 (allowable value of the moment load that the transport device 10 bears) is set or defined depending on the amount of tilting allowed for the transport device 10 (the travel portion 13 and the main body portion 17, etc.) and on, among other factors, magnitude of the moment load allowed for each component and member in the transport device 10.

As shown in FIGS. 3 and 6, in the present embodiment, rotatable rollers which can be rotated about respective axes extending along the travel path (i.e., about axes extending along the path longitudinal direction Y) are used as the supported portions 20. And as shown in FIGS. 1, 2, and 6, each support portion 30 is formed to have, on its upper side, a flat supporting surface that extends along the path width direction X. Thus, even if the supported portions 20 and the support portions 30 come into contact with each other when the second support component 12 is moved between the retracted position and the projected position, due, for example, to variations in dimensions, error or variations in the mounting positions, changes in shapes that occur over time, etc., of the component parts, the impact of contact between the supported portions 20 and the support portions 30 is reduced in magnitude or alleviated, as a result of the fact that the rotatable rollers roll on the supporting surfaces, so that the second support component 12 can be moved smoothly along the path width direction X, and so that generation of the dust due to the contact between the supported portions 20 and the support portions 30 can be reduced.

In the present embodiment, the supporting surfaces formed on the top side of the support portions 30 are formed to have a constant width along the path longitudinal direction Y, over the length along the path width direction X. In addition, each of the supporting surfaces is formed to be a horizontal surface. And in the present embodiment, as shown in FIGS. 1 and 2, a ramp or sloped portion 33 is connected to each end portion of the support portion 30 that is on the inward side along the path width direction X. Each ramp portion has a flat sloped upper surface that is sloped or tilted to be lower toward its free end on the inward side along the path width direction X. And the sloped surface of each sloped portion 33 is continuous with the portion of the supporting surface of the corresponding support portion 30 (that is on the inward side along the path width direction X) and extends inward along the path width direction X. By providing these sloped portions 33, it is possible to alleviate more reliably the impact of the contact between the supported portions 20 and the support portions 30.

OTHER EMBODIMENTS

Other embodiments of the article transport facility are described next. Note that arrangements and structures disclosed in any of the following embodiments may be combined with those disclosed in any other embodiment as long as no inconsistency arises as a result of such combination.

Figure 8:
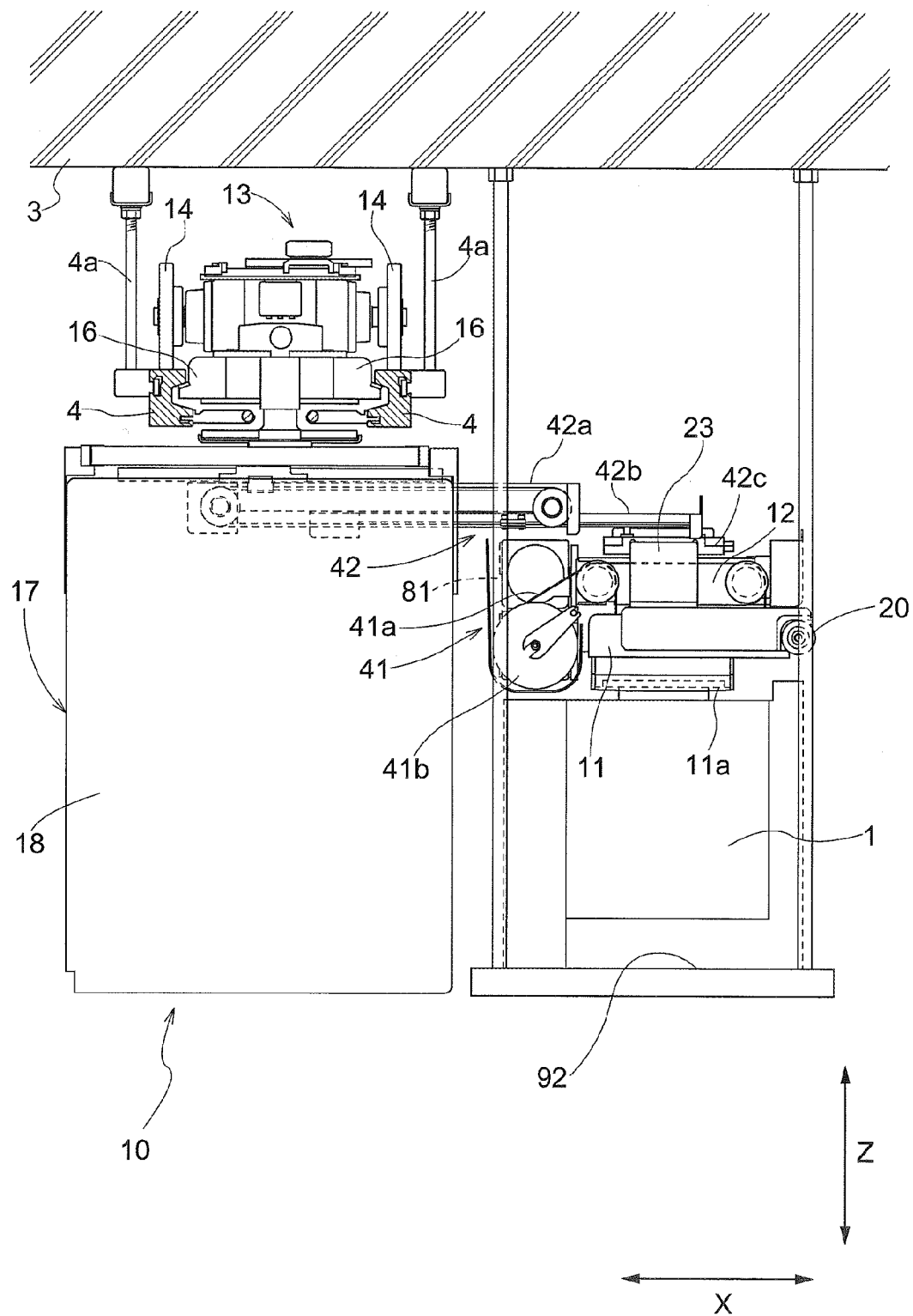
FIG. 8 is a front view of a part of the article transport facility in accordance with another embodiment.

(1) In the embodiment described above, the first control and the second control for transferring an article 1 between the transport device 10 and a transport target location 90 are described as examples of operational controls of the transport device 10 performed by the controller 80. However, the controls performed by the controller 80 are not limited to controls for transferring an article 1 between the transport device 10 and a transport target location 90. And the controls performed by the controller 80 may include a control for transferring an article 1 between the transport device 10 and a second transport target location 92, which is different from the above transport target location 90 (hereinafter referred to as "the first transport target location 91"). The second transport target location 92 can also serve as a transport origin or a transport destination for an article 1 for a transporting operation by the transport device 10, as in the case of the first transport target location 91. In an example shown in FIG. 8, the second transport target location 92 is located at a position that is higher than the first transport target location 91 (see FIG. 5) and that is outside the travel path along the path width direction X. Unlike the first transport target location 91, this second transport target location 92 is located at such a height that it overlaps with the travel path as seen along the path width direction X. FIG. 8 shows an example of a second transport target location 92 that is formed by a storage shelf which is suspended from and supported by the ceiling 3 for temporarily storing an article 1.

As described in the embodiment described above, when the first transport target location 91 (transport target location 90) is a transport origin or a transport destination for an article 1 for a transporting operation by the transport device 10, the controller 80 performs a control for causing the transport device 10 to travel to the position along the travel path that corresponds to the first transport target location 91 and for subsequently causing the second support component 12 to be accelerated at a first acceleration and then decelerated at a first deceleration to cause it to be moved from the retracted position to the projected position (referred to hereinafter as the "first projected position"). Similarly, when the second transport target location 92 is a transport origin or a transport destination for an article 1 for a transporting operation by the transport device 10, the controller 80 performs a control for causing the transport device 10 to travel to the position along the travel path that corresponds to the second transport target location 92 and for subsequently causing its second support component 12 to be accelerated at a second acceleration and then decelerated at a second deceleration to cause it to be moved from the retracted position to a position (i.e., the position of the second support component 12 as shown in FIG. 8 and referred to hereinafter as the "second projected position") in which the second support component 12 overlaps with the second transport target location 92 as seen along the vertical direction Z. While detailed description is omitted, controls, such as an attitude change control for the pair of grip portions 11a, are performed when the second support component 12 is located at the second projected position, to transfer the article 1 between the first support component 11 and the second transport target location 92. Note that the amount of projection from the retracted position to the second projected position along the path width direction X is identical to the amount of projection from the retracted position to the first projected position along the path width direction X.

As described above, as the amount of waiting time, required for an oscillation of the first support component 11 which is suspended and supported by the second support component 12 to diminish to an allowable range for properly transferring the article 1 between the transport device 10 and the transport target location 90, gets longer, then the transport efficiency decreases by the corresponding amount. And the allowable amplitude of oscillation of the first support component 11 for properly transferring an article 1 (for example, an allowable angle of lateral swaying about the second support component 12) is generally smaller when transferring an article 1 between the transport device 10 and the first transport target location 91 (which is located at a lower position than the second transport target location 92) than when transferring an article 1 between the transport device 10 and the second transport target location 92. In light of this point, it is preferable that the first acceleration, the first deceleration, the second acceleration, and the second deceleration (which collectively will be referred to hereafter as "each acceleration/deceleration") are set so as to satisfy at least one of; a condition that the absolute value of the first acceleration is smaller than the absolute value of the second acceleration; and a condition that the absolute value of the first deceleration is smaller than the absolute value of the second deceleration. By so setting these values, the amplitude of oscillation of the first support component 11 at the time when the second support component 12 has just been moved from the retracted position to the first projected position can be reduced to be smaller than the amplitude of oscillation of the first support component 11 at the time when the second support component 12 has just been moved from the retracted position to the second projected position. As a result, it becomes possible to have a proper transport efficiency. For example, each acceleration/deceleration may be set so as to satisfy both of the condition that the absolute value of the first acceleration is smaller than the absolute value of the second acceleration and the condition that the absolute value of the first deceleration is smaller than the absolute value of the second deceleration. Alternatively, each acceleration/deceleration may be set so as to satisfy, only in the loaded state, at least one of the condition that the absolute value of the first acceleration is smaller than the absolute value of the second acceleration and the condition that the absolute value of the first deceleration is smaller than the absolute value of the second deceleration.

In the example shown in FIG. 8, the transport device 10 is provided with a pair of contact bodies 16 for preventing the travel portion 13 from tilting. The pair of contact bodies 16 are located between the pair of travel rails 4. And when transferring an article 1 between the transport device 10 and the second transport target location 92, the tilting of the travel portion 13 can be prevented when the second support component 12 is located in the second projected position, by causing each of the pair of contact bodies 16 to come into contact with the corresponding travel rail 4 from the inward side along the path width direction X. In addition, an upward-facing sloped surface, which is lower toward its outer end along the path width direction, is formed in each contact body 16. And the tilting of the travel portion 13 is prevented as a result of the fact that this sloped surface comes into contact with a downward-facing sloped surface, which is formed in the corresponding travel rail 4 and which is lower toward its outer end along the path width direction. Thus, when the tilting prevention mechanism (a pair of contact bodies 16 in the present example) for preventing the tilting of the travel portion 13 is provided, the tilting prevention mechanism may be operated also when transferring an article between the transport device 10 and the first transport target location 91 (transport target location 90) to prevent the tilting of the travel portion 13 when the second support component 12 is located at the first projected position. In this case, the support member 5 and the tilting prevention mechanism can cooperate with each other to receive the moment load that occurs in the transport device 10; thus, it is possible to decrease the weight-bearing performance or capability required for the support member 5 to simplify the structure of the support member 5.

Note that, although an example is described here in which the second transport target location 92 is located at such a height that it overlaps with the travel path as seen along the path width direction X, the second transport target location 92 may be located at a position that is lower than the travel path and that is higher than the first transport target location 91. In such a case, a support member 5 may be provided also to the second transport target location 92 as with the case of the first transport target location 91 so that each of the first transport target location 91 and the second transport target location 92 is, or corresponds to, or can function as, the transport target location 90.

(2) In the embodiment described above, an example is described in which the support member 5 is attached to a travel rail 4 such that only a part of the load (including weight) that acts on the support member 5 can be supported by the ceiling 3 through the travel rail 4. However, the invention is not limited to such an arrangement. And the support member 5 may be attached to the travel rail 4 such that the entire load (including weight) that acts on the support member 5 is supported by the ceiling 3 through the travel rail 4. Alternatively, the support member 5 may be supported directly by the ceiling 3 such that the entire load (including weight) that acts on the support member 5 is supported by the ceiling 3 and not through the travel rail 4.

(3) In the embodiment described above, an example is described in which the supported portions 20 are rotatable rollers which are rotatable about respective axes extending along travel path. However, the invention is not limited to such arrangement. The supported portions 20 may be members attached to the second support component 12 such that they cannot rotate relative to the second support component. The supported portions 20 do not have to be members that are provided separately from (i.e., in addition to) the second support component 12 but may be portions of members that form the second support component 12. In addition, in the embodiment described above, an example is described in which each support portion 30 has, on its upper side, a flat supporting surface which extends along the path width direction X. However, the invention is not limited to such arrangement. For example, each support portion 30 may have, as its supporting surface on its upper side, a concave surface that extends along the path width direction X (a surface whose central portion along the path longitudinal direction Y is curved or recessed downward relative to its both end portions along the path longitudinal direction Y).

(4) In the embodiment described above, an example is described in which the second support component 12 has two supported portions 20 and the support member 5 has two support portions 30. However, the invention is not limited to such arrangement. The second support component 12 may have only one or, three or more supported portions 20. In case the second support component 12 has three or more supported portions 20, a separate support portion 20 may be provided for each of the supported portions 30. Alternatively, a common support portion 30 may be provided that is used by all of the plurality of supported portions 20.

(5) In the embodiment described above, an example is described in which the distance D along the vertical direction Z between the support portions 30 and the supported portions 20 in the projected state is set such that the distance D is greater than zero when the first support component 11 is located at the first height. However, the invention is not limited to such arrangement. And the distance D may be set such that it is zero when the first support component 11 is located at the first height. In addition, the distance D may be set such that it is greater than zero when the first support component 11 is located at the first height in the empty load state and such that it is zero when the first support component 11 is located at the first height in a loaded state.

(6) In the embodiment described above, an example is described in which the top surfaces of the support portions 30, i.e., the supporting surfaces formed in the support portions 30, are formed to be horizontal surfaces. However, the invention is not limited to such arrangement. The supporting surfaces of the support portions 30 may be, for example, sloped downward toward the inward side along the path width direction.

(7) In the embodiment described above, an example is described in which the main body portion 17 is suspended from and supported by the travel portion 13. However, the invention is not limited to such arrangement. The main body portion 17 may be supported by the travel portion 13 such that the main body portion 17 is located above the travel portion 13.

(8) In the embodiment described above, an example is described in which each article 1 is a container for holding one or more substrates, such as semiconductor substrates. However, the invention is not limited to such arrangement. For example, each article 1 may be a container for holding objects that are other than substrates, such as industrial products, food, and medicine. In addition, each article 1 may be any object other than a container.

(9) In the embodiment described above, it should be understood that the embodiments disclosed in the present specification are merely examples in all respects. Accordingly, a person skilled in the art will be able to make appropriate modifications and changes without falling outside of the spirit of the present disclosure.

SUMMARY OF EMBODIMENTS DESCRIBED ABOVE

A brief summary of the article transport facility described above is provided next.

In light of issues associated with the conventional art, an article transport facility is arranged as follows. Specifically, the article transport facility comprises a transport device capable of traveling along a travel path formed on a ceiling side to transport an article, and a transport target location which functions as a transport origin or a transport destination for an article for a transporting operation by the transport device, wherein the transport target location is located at a position that is lower than the travel path and that is outside the travel path along a path width direction which is a lateral width direction of the travel path, wherein the transport device includes a travel portion capable of traveling in and along the travel path, a first support component capable of supporting an article, a second support component which suspends and supports the first support component, a first actuator capable of vertically moving the first support component with respect to the second support component, and a second actuator capable of moving the second support component along the path width direction with respect to the travel portion between a retracted position in which the second support component is in the travel path and a projected position in which the second support component overlaps with the transport target location as seen along a vertical direction. The characteristic feature of such article transport facility is that a support member is provided which is capable of supporting the second support component from below while allowing a vertical movement of the first support component with respect to the second support component, in a projected state which is a state in which the second support component is located in the projected position, wherein the support member is supported directly or indirectly by a ceiling.

In other words, the article transport facility is provided with a support member capable of supporting the second support component from below, in the projected state. Therefore, in the projected state in which a large moment load tends to occur in the transport device because the second support component is in the projected position, the support member can receive a load due to the second support component which suspends and supports the first support component. Thus, the moment load that the transport device has to bear can be reduced by the corresponding amount. As a result, the magnitude of the moment load that the transport device bears can be reduced to within a proper range, in the projected state so that it becomes possible to restrict the tilting of the transport device.

And the support member is not a member provided to the transport device, and the transport device only needs to have a structure to transmit a load to the support member. As such, an arrangement for receiving the load due to the second support component is realized by the support member while the structure of the transport device can be kept from becoming more complex and an amount of any increase in the weight of the transport device can be reduced. In addition, if and when a tilting prevention mechanism is provided to the transport device, in addition to the support member, it is possible to decrease the weight-bearing requirement for the tilting prevention mechanism by the corresponding amount. Thus, a tilting prevention mechanism having a relatively simple structure can be used. Therefore, even when a tilting prevention mechanism is provided to the transport device in addition to the support member, the structure of the transport device can be kept from becoming more complex and an amount of any increase in the weight of the transport device can be reduced, compared with when the support member is not provided.

As such, with the characteristic arrangement described above, an article transport facility can be provided in which the tilting of the transport device in the projected state can be restricted while the structure of the transport device can be kept from becoming more complex and an amount of any increase in the weight of the transport device can be reduced. Note that, since the support member is supported directly or indirectly by the ceiling, the support member can receive the load due to the second support component with stability. In addition, since the support member is provided such as to allow the vertical movement of the first support component with respect to the second support component, an article can be transferred between the transport device and the transport target while the support member receives the load due to the second support component.

Here, the travel portion is preferably configured to travel along the travel path with the travel portion supported by a rail suspended from the ceiling, wherein the support member is preferably attached to the travel rail such that at least a part of a load that acts on the support member is supported by the ceiling through the travel rail.

That is, compared with a case in which the support member is not attached to the travel rail, the number of members for connecting the support member to the ceiling directly can be reduced, or the arrangement may be such that there is no need for members for connecting the support member to the ceiling directly. Therefore, even when the support member needs to be installed to the ceiling to which lighting devices, and/or fire extinguisher system, etc. are attached, the constraint on the positioning of the support member can be made less stringent compared with a case in which the support member is not attached to the travel rail. That is, the support member can be supported directly or indirectly by the ceiling while reducing the effects on other members attached to the ceiling (e.g., need to alter the layout etc.).

In addition, the support member preferably has a support portion located at a position at which, as seen along the vertical direction, the support portion overlaps, from below, with a supported portion provided to the second support component, in the projected state, wherein the first actuator is preferably configured to vertically move the first support component, with the second support component in the retracted position, between a first height at which the first support component is located in the travel path, and a second height which is lower than the first height and which is a height for transferring an article between the transport target location and the first support component, and wherein a vertical distance between the support portion and the supported portion in the projected state is preferably set such as to be greater than zero when the first support component is at the first height.

That is, by positioning the first support component at the first height when causing the second support component to move between the retracted position and the projected position, a contact between the supported portion provided to the second support component and the support portion provided to the support member can be basically avoided. As a result, it becomes possible to avoid problems which may occur due to the contact between the supported portion and the support portion, such as, among other possibilities, lowering of article transporting efficiency, any damages to the article or to the contents held in the article, and generation of dust. Note that the lowering of article transporting efficiency may occur when the amount of waiting time, required for the oscillation (or lateral swinging) of the first support component which is suspended and supported by the second support component to diminish to an allowable range for properly transferring an article between the transport device and a transport target location, becomes longer due to an impact of a contact between the supported portion and the support portion.

In addition, the support member preferably has a support portion located at a position at which, as seen along the vertical direction, the support portion overlaps, from below, with a supported portion provided to the second support component, in the projected state, wherein the second support component is preferably supported by the support member from below when the supported portion and the support portion are in contact with each other, wherein the supported portion is preferably a rotatable roller which is rotatable about an axis extending along the travel path, and wherein the support portion preferably has, on an upper side thereof, a flat supporting surface which extends along the path width direction.

That is, the support member can properly receive the load due to the second support component, when the supported portion and the support portion are in contact with each other. In addition, with the arrangement described above, since the supported portion is a rotatable roller and the support portion has, on an upper side thereof, a flat supporting surface, the impact of contact between the supported portion and the support portion is reduced in magnitude or alleviated, as a result of the fact that the rotatable roller roll on the supporting surface, so that the second support component can be moved smoothly along the path width direction, and so that generation of the dust due to the contact between the supported portion and the support portion can be reduced.

In addition, the second support component preferably has a first supported portion and a second supported portion which are two supported portions with one located on one side and the other located on the other side, of a central portion of the second support component along a direction along the travel path, wherein the support member preferably has a first support portion which is a support portion located at a position at which the first support portion overlaps, from below, with the first supported portion, in the projected state, as seen along the vertical direction, and a second support portion which is a support portion located at a position at which the second support portion overlaps, from below, with the second supported portion, in the projected state, as seen along the vertical direction, and wherein the second support component is preferably supported by the support member from below, when the first supported portion and the first support portion are in contact with each other and when the second supported portion and the second support portion are in contact with each other.

In other words, the support member can properly receive the load due to the second support component when the first supported portion and the first support portion are in contact with each other and when the second supported portion and the second support portion are in contact with each other. When this happens, the load due to the second support component can be received on each side of the central portion of the second support component along a direction along the travel path, by the support member; thus, the attitude of the second support component when receiving the load due to the second support component can be stabilized.

In addition, a first transport target location is preferably provided as the transport target location, wherein a second transport target location is preferably provided separately from the first transport target location to function as a transport origin or a transport destination for an article for a transporting operation by the transport device, wherein a controller for controlling operation of the transport device is preferably provided, wherein the second transport target location is preferably located at a position that is higher than the first transport target location and that is outside the travel path along the path width direction, wherein, when the first transport target location is a transport origin or a transport destination for an article for a transporting operation by the transport device, the controller preferably performs a control for causing the transport device to travel to a position along the travel path that corresponds to the first transport target location and subsequently causing the second support component to be accelerated at a first acceleration and then decelerated at a first deceleration, to cause the second support component to be moved from the retracted position to the projected position, wherein, when the second transport target location is a transport origin or a transport destination for an article for a transporting operation by the transport device, the controller preferably performs a control for causing the transport device to travel to a position along the travel path that corresponds to the second transport target location and subsequently causing the second support component to be accelerated at a second acceleration and then decelerated at a second deceleration, to cause the second support component to be moved from the retracted position to a position which overlaps with the second transport target location as seen along a vertical direction, and wherein the first acceleration, the first deceleration, the second acceleration, and the second deceleration are preferably set so as to satisfy at least one of; a condition that an absolute value of the first acceleration is smaller than an absolute value of the second acceleration; and a condition that an absolute value of the first deceleration is smaller than an absolute value of the second deceleration.

That is, since the first transport target location is located at position lower than the second transport target location, And the allowable amplitude of oscillation of the first support component (for example, an allowable angle of lateral swaying about the second support component) for properly transferring an article to the first transport target location is smaller than the allowable amplitude of oscillation of the first support component when transferring an article to the second transport target location. In this respect, with the arrangement described above, the first acceleration, the first deceleration, the second acceleration, and the second deceleration are set so as to satisfy at least one of a condition that the absolute value of the first acceleration is smaller than an absolute value of the second acceleration and a condition that the absolute value of the first deceleration is smaller than an absolute value of the second deceleration. Thus, the amplitude of oscillation of the first support component at the time when the second support component has just been moved from the retracted position to the first projected position when transferring an article to the first transport target location can be reduced to be smaller than the amplitude of oscillation of the first support component at the time when the second support component has just been moved from the retracted position to the position which overlaps with the second transport target location as seen along a vertical direction when transferring an article to the second transport target location. As such, it becomes possible to have a proper transport efficiency by reducing the amount of any increase in the amount of time required to transfer an article between the first transport target location and the transport device.

What is claimed is:

1. An article transport facility comprising:
a transport device capable of traveling along a travel path formed on a ceiling side to transport an article; and
a transport target location which functions as a transport origin or a transport destination for an article for a transporting operation by the transport device;
wherein the transport target location is located at a position that is lower than the travel path and that is outside the travel path along a path width direction which is a lateral width direction of the travel path,
wherein the transport device includes a travel portion capable of traveling in and along the travel path, a first support component capable of supporting an article, a second support component which suspends and supports the first support component, a first actuator capable of vertically moving the first support component with respect to the second support component, and a second actuator capable of moving the second support component along the path width direction with respect to the travel portion between a retracted position in which the second support component is in the travel path and a projected position in which the second support component overlaps with the transport target location as seen along a vertical direction,
wherein a support member is provided which is capable of supporting the second support component from below while allowing a vertical movement of the first support component with respect to the second support component, in a projected state which is a state in which the second support component is located in the projected position, and wherein the support member is supported directly or indirectly by a ceiling.

2. The article transport facility as defined in claim 1, wherein the travel portion is configured to travel along the travel path with the travel portion supported by a travel rail suspended from the ceiling, wherein the support member is attached to the travel rail such that at least a part of a load that acts on the support member is supported by the ceiling through the travel rail.

3. The article transport facility as defined in claim 1, wherein the support member has a support portion located at a position at which, as seen along the vertical direction, the support portion overlaps, from below, with a supported portion provided to the second support component, in the projected state, wherein the first actuator is configured to vertically move the first support component, with the second support component in the retracted position, between a first height at which the first support component is located in the travel path, and a second height which is lower than the first height and which is a height for transferring an article between the transport target location and the first support component, and wherein a vertical distance between the support portion and the supported portion in the projected state is set such as to be greater than zero when the first support component is at the first height.

4. The article transport facility as defined in claim 1, wherein the support member has a support portion located at a position at which, as seen along the vertical direction, the support portion overlaps, from below, with a supported portion provided to the second support component, in the projected state, wherein the second support component is supported by the support member from below when the supported portion and the support portion are in contact with each other, wherein the supported portion is a rotatable roller which is rotatable about an axis extending along the travel path, and wherein the support portion has, on an upper side thereof, a flat supporting surface which extends along the path width direction.

5. The article transport facility as defined in claim 1, wherein the second support component has a first supported portion and a second supported portion which are two supported portions with one located on one side and the other located on the other side, of a central portion of the second support component along a direction along the travel path, wherein the support member has a first support portion which is a support portion located at a position at which the first support portion overlaps, from below, with the first supported portion, in the projected state, as seen along the vertical direction, and a second support portion which is a support portion located at a position at which the second support portion overlaps, from below, with the second supported portion, in the projected state, as seen along the vertical direction, and wherein the second support component is supported by the support member from below, when the first supported portion and the first support portion are in contact with each other and when the second supported portion and the second support portion are in contact with each other.

6. The article transport facility as defined in claim 1, wherein a first transport target location is provided as the transport target location, wherein a second transport target location is provided separately from the first transport target location to function as a transport origin or a transport destination for an article for a transporting operation by the transport device, wherein a controller for controlling operation of the transport device is provided, wherein the second transport target location is located at a position that is higher than the first transport target location and that is outside the travel path along the path width direction, wherein, when the first transport target location is a transport origin or a transport destination for an article for a transporting operation by the transport device, the controller performs a control for causing the transport device to travel to a position along the travel path that corresponds to the first transport target location and subsequently causing the second support component to be accelerated at a first acceleration and then decelerated at a first deceleration, to cause the second support component to be moved from the retracted position to the projected position, wherein, when the second transport target location is a transport origin or a transport destination for an article for a transporting operation by the transport device, the controller performs a control for causing the transport device to travel to a position along the travel path that corresponds to the second transport target location and subsequently causing the second support component to be accelerated at a second acceleration and then decelerated at a second deceleration, to cause the second support component to be moved from the retracted position to a position which overlaps with the second transport target location as seen along a vertical direction, and wherein the first acceleration, the first deceleration, the second acceleration, and the second deceleration are set so as to satisfy at least one of;

a condition that an absolute value of the first acceleration is smaller than an absolute value of the second acceleration;

and a condition that an absolute value of the first deceleration is smaller than an absolute value of the second deceleration.

* * * * *

UNITED STATES PATENT AND TRADEMARK OFFICE
CERTIFICATE OF CORRECTION

PATENT NO. : 9,896,283 B2
APPLICATION NO. : 15/352916
DATED : February 20, 2018
INVENTOR(S) : Tomohiko Tsuji et al.

It is certified that error appears in the above-identified patent and that said Letters Patent is hereby corrected as shown below:

On the Title Page

Column 2, Line 1, Other Publications delete "20132" and insert -- 2012 --

In the Claims

Column 26, Line 50, Claim 6, delete "of;" and insert -- of: --

Signed and Sealed this
Fifteenth Day of May, 2018

Andrei Iancu
*Director of the United States Patent and Trademark Office*